(12) United States Patent
Kim et al.

(10) Patent No.: US 9,070,599 B2
(45) Date of Patent: Jun. 30, 2015

(54) ARRAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Heecheol Kim, Beijing (CN); Youngsuk Song, Beijing (CN); Seongyeol Yoo, Beijing (CN); Seungjin Choi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/361,396

(22) PCT Filed: Oct. 31, 2013

(86) PCT No.: PCT/CN2013/086368
§ 371 (c)(1),
(2) Date: May 29, 2014

(87) PCT Pub. No.: WO2014/153958
PCT Pub. Date: Oct. 2, 2014

(65) Prior Publication Data
US 2015/0028342 A1    Jan. 29, 2015

(30) Foreign Application Priority Data
Mar. 25, 2013    (CN) .......................... 201310097845.2

(51) Int. Cl.
    *H01L 27/12*      (2006.01)
    *G02F 1/1362*      (2006.01)
    (Continued)

(52) U.S. Cl.
    CPC .......... *H01L 27/124* (2013.01); *G02F 2201/40* (2013.01); *H01L 21/76802* (2013.01);
    (Continued)

(58) Field of Classification Search
    CPC ............ H01L 27/124; H01L 29/66765; H01L 29/78678; H01L 21/76802; G02F 1/136227; G02F 1/136286; G02F 2201/40
    USPC ............................................. 257/72; 438/158
    See application file for complete search history.

(56) References Cited

U.S. PATENT DOCUMENTS

| | | | |
|---|---|---|---|
| 6,265,249 B1 * | 7/2001 | Wu ............................... | 438/158 |
| 6,507,045 B2 * | 1/2003 | Gu et al. ........................ | 257/72 |

(Continued)

FOREIGN PATENT DOCUMENTS

| | | |
|---|---|---|
| CN | 1991465 A | 7/2007 |
| CN | 102368499 A | 3/2012 |

(Continued)

OTHER PUBLICATIONS

International Search Report, International Preliminary Report on Patentability and Written Opinion of the International Searching Authority of PCT/CN2013/086368 in Chinese, mailed Jan. 23, 2014.

(Continued)

*Primary Examiner* — Steven J Fulk
(74) *Attorney, Agent, or Firm* — Collard & Roe, P.C.

(57) ABSTRACT

An array substrate, a manufacturing method thereof and a display device are provided, and the array substrate comprises: a substrate (1); a plurality of data lines (16), formed on the substrate and extending in a first direction; a plurality of gate lines (15), formed on the substrate (1), crossing the plurality of data lines (15), and extending in a second direction perpendicular to the first direction; a plurality of pixel regions, defined by the plurality of gate lines (15) and the plurality of data lines (15) crossing each other and arranged in a matrix form, wherein each of the pixel regions is provided with a thin film transistor and a pixel electrode (12), wherein, the thin film transistor comprises: a gate electrode (2), connected with one of the plurality of gate lines (15); a gate insulating layer (3), provided above the gate line (15) and the gate electrode (2); an active layer (5), formed on the gate insulating layer (3) and disposed corresponding to the gate electrode (2); a drain electrode (8) and a source electrode (9), disposed opposite to each other above the active layer (5) and having a channel region of the thin film transistor therebetween; a filling layer (4), provided between the gate electrode (2) and the gate line (15) connected with the gate electrode, and the drain and source electrodes (8) and (9); and a passivation layer (10), provided on the source electrode (9), the drain electrode (8) and the active layer (5), wherein at a position directly facing the gate line (15), the passivation layer (10) is provided with a passivation layer through hole (11) configured to perform a connection between the drain electrode (8) and the pixel electrode (12).

14 Claims, 6 Drawing Sheets

(51) Int. Cl.
  G02F 1/1368     (2006.01)
  H01L 29/786    (2006.01)
  H01L 21/283    (2006.01)
  H01L 21/3213   (2006.01)
  H01L 23/31     (2006.01)
  H01L 29/10     (2006.01)
  H01L 21/768    (2006.01)
  H01L 29/66     (2006.01)
  H01L 29/417    (2006.01)

(52) U.S. Cl.
  CPC ......... *H01L29/66765* (2013.01); *G02F 1/1362* (2013.01); *G02F 1/1368* (2013.01); *H01L 29/41733* (2013.01); *H01L 29/78696* (2013.01); *H01L 27/1248* (2013.01); *H01L 21/283* (2013.01); *H01L 21/32133* (2013.01); *H01L 23/3171* (2013.01); *H01L 27/1259* (2013.01); *H01L 27/1288* (2013.01); *H01L 29/1033* (2013.01); *H01L 29/4175* (2013.01)

(56) References Cited

U.S. PATENT DOCUMENTS

| | | | | |
|---|---|---|---|---|
| 8,860,917 | B2* | 10/2014 | Chen et al. | 349/149 |
| 2003/0117542 | A1* | 6/2003 | Choo | 349/43 |
| 2004/0125262 | A1 | 7/2004 | Cho et al. | |
| 2006/0033106 | A1* | 2/2006 | Seo et al. | 257/66 |
| 2007/0153206 | A1* | 7/2007 | Lim et al. | 349/141 |
| 2008/0237594 | A1* | 10/2008 | Lin et al. | 257/57 |
| 2009/0091678 | A1* | 4/2009 | Jeong et al. | 349/46 |
| 2011/0255045 | A1* | 10/2011 | Son et al. | 349/139 |
| 2012/0223313 | A1* | 9/2012 | Amano | 257/59 |
| 2013/0215354 | A1* | 8/2013 | Yoon et al. | 349/46 |
| 2013/0306972 | A1* | 11/2013 | Ryu et al. | 257/59 |
| 2013/0320339 | A1* | 12/2013 | Kawashima et al. | 257/43 |

FOREIGN PATENT DOCUMENTS

| | | |
|---|---|---|
| CN | 102629576 A | 8/2012 |
| CN | 102809855 A | 12/2012 |
| CN | 103178119 A | 6/2013 |

OTHER PUBLICATIONS

Chinese Office Action of Chinese Application No. 201310097845.2, mailed Feb. 2, 2015 with English translation.

\* cited by examiner

ARRAY SUBSTRATE, MANUFACTURING METHOD THEREOF AND DISPLAY DEVICE

CROSS REFERENCE TO RELATED APPLICATIONS

This application is the National Stage of PCT/CN2013/086368 filed on Oct. 31, 2013, which claims priority under 35 U.S.C. §119 of Chinese Application No. 201310097845.2 filed on Mar. 25, 2013, the disclosure of which is incorporated by reference.

TECHNICAL FIELD

The embodiments of the present invention relate to an array substrate, a manufacturing method of the array substrate, and a display device.

BACKGROUND

A liquid crystal display (LCD) has played a leading role in the field of flat panel display due to advantages such as stable picture, realistic image, low radiation, small volume and low energy consumption. A TFT-LCD (thin film transistor-liquid crystal display) is currently a mainstream liquid crystal display.

A very important parameter of the liquid crystal display is a light transmittance, and an important factor that determines the light transmittance is the aperture ratio. Simply speaking, the aperture ratio is a ratio of an effective region that can transmit light to a total region. A liquid crystal panel comprises an array substrate and a color filter substrate, wherein, the planar schematic view of the array substrate is shown in FIG. 1, a gate line 15' is provided on the array substrate, and a data line 16' is provided perpendicular to the gate line 15', the gate line 15' and the data line 16' cross each other to define a pixel region, a thin film transistor and a pixel electrode 12' are disposed in the pixel region, a gate electrode 2' of the thin film transistor is connected with the gate line 15', a source electrode 9' is connected with the data line 16', and the drain electrode 8' is connected with the pixel electrode 12' through a passivation layer through hole 11'. When light is emitted from a backlight source, not all of the light can pass through the panel, for example, a region where a drive chip, a signal wiring, a thin film transistor, a storage capacitor and etc. are disposed may not be completely transmissive, it is also possible that the light passing through the region is not affected by a liquid crystal layer, thus correct gray level cannot be displayed, so a BM (Black Matrix) is needed to shield such region so as not to disturb the correct brightness of other light-transmitting regions, therefore, exemplarily, a remaining effective light-transmitting region is only a region A in FIG. 1, and a ratio of the effective light-transmitting region to a total region is called the aperture ratio. The light transmittance and the resolution can be improved under a condition that the aperture ratio is enhanced, and meanwhile, the brightness of the backlight source need not be too high, thus, the power consumption and the cost can be lowered.

In prior art, to improve the aperture ratio, various factors affecting the aperture ratio are optimized continuously. However, in prior art, the passivation layer through hole usually is not provided above the gate line region, a capacitance $C_{gs}$ formed between the gate line and the source electrode, the pixel electrode is 30 fF-100 fF, thus a leaping voltage $\Delta V_p$ is within a range of 0.5V-1.0V; if the passivation layer through hole is provided above the gate line region, the effective light-transmitting region can be increased to a large extent, and thus, the aperture ratio of the pixel can be increased; however, if the passivation layer through hole is directly provided above the gate line, the capacitance $C_{gs}$ formed between the gate line and the source electrode, the pixel electrode is 200 fF-500 fF, thus the leaping voltage $\Delta V_p$ is within a range of 2.5V-7.0V, as the leaping voltage is too large, defects such as a image flicker and an image sticking may be incurred.

SUMMARY

The embodiments of the present invention provide an array substrate in which a passivation layer through hole is provided above a gate line region, so as to increase a effective light-transmitting region and in turn enhance the aperture ratio of a pixel, improve the light transmittance, increase the resolution and the display quality, and furthermore, the embodiments of the present invention further provide a manufacturing method of the array substrate and a display device using the array substrate.

The array substrate according to the embodiments of the present invention comprises: a substrate; a plurality of data lines, formed on the substrate and extending in a first direction; a plurality of gate lines, formed on the substrate, crossing the plurality of data lines, and extending in a second direction perpendicular to the first direction; a plurality of pixel regions, defined by the plurality of gate lines and the plurality of data lines crossing each other and arranged in a matrix form, wherein each of the pixel regions is provided with a thin film transistor and a pixel electrode, wherein, the thin film transistor comprises: a gate electrode, connected with one of the plurality of gate lines; a gate insulating layer, provided above the gate line and the gate electrode; an active layer, formed on the gate insulating layer and disposed corresponding to the gate electrode; a drain electrode and a source electrode, disposed opposite to each other above the active layer and having a channel region of the thin film transistor therebetween; a filling layer, provided between the gate electrode and the gate line connected with the gate electrode, and the drain and source electrodes; and a passivation layer, provided on the source electrode, the drain electrode and the active layer, wherein at a position directly facing the gate line, the passivation layer is provided with a passivation layer through hole configured to perform a connection between the drain electrode and the pixel electrode.

Alternatively, a thickness of the filling layer is 5000 Å-25000 Å.

Alternatively, the filling layer is formed with a dielectric material.

Alternatively, the filling layer is formed by a curing reaction of a photosensitive resin.

Alternatively, the channel region presents a U shape which opening turns its back to the data lines.

Alternatively, a width of the gate line is equal to a width of the channel region.

The embodiments of the present invention further provide a manufacturing method of the above array substrate, comprising: S1, providing a substrate; S2, forming a gate line and a gate electrode on the substrate; S3, forming a gate insulating layer covering the entirety of the substrate on the gate line and the gate electrode; S4, forming a filling layer on the gate insulating layer, and the filling layer being formed between the gate electrode and the gate line connected with the gate electrode, and drain and source electrodes formed subsequently; S5, forming an active layer, the drain electrode and the source electrode on the substrate with the gate insulating layer and the filling layer formed thereon; S6, forming a passivation layer on the source electrode, the drain electrode and the active layer, wherein the passivation layer is provided with a passivation layer through hole at a position right above the gate line and the drain electrode; and S7, forming a pixel electrode on the passivation layer which is connected with the drain electrode through the passivation layer through hole.

Alternatively, the step S4 comprises: S401, coating a layer of photosensitive resin on the gate insulating layer; S402, through a exposing process using a double-tone mask, forming a photosensitive resin-completely-retained region corresponding to the filling layer, a photosensitive resin-partly-retained region corresponding to the channel region, and a photosensitive resin-completely-removed region corresponding to a gate electrode connection region; S403, after a developing treatment, removing the gate insulating layer in the photosensitive resin-completely-removed region through an etching process; and S404, removing the photosensitive resin in the photosensitive resin-partly-retained region through an asking process to expose the gate insulating layer.

Alternatively, the step S5 comprises: S501, depositing a semiconductor layer, a doping semiconductor layer and a source/drain metal layer on the gate insulating layer and the filling layer; S502, coating a layer of photoresist on the source/drain metal layer; S503, through a exposing process using a double-tone mask, forming a photoresist-completely-retained region corresponding to regions of the source electrode and the drain electrode, a photoresist-partly-retained region corresponding to the channel region, and a photoresist-completely-removed region corresponding to regions expect the above regions; S504, after a developing treatment, removing the source/drain metal layer, the doping semiconductor layer and the semiconductor layer in the photoresist-completely-removed region through a first etching process; S505, removing the photoresist in the photoresist-partly-retained region through an ashing process; S506, removing the source/drain metal layer and the doping semiconductor layer in the photoresist-partly-retained region through a second etching process, and removing a part of the semiconductor layer in a thickness direction; and S507, removing the remaining photoresist.

The embodiments of the present invention further provide a display device comprising any one of the above array substrates.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
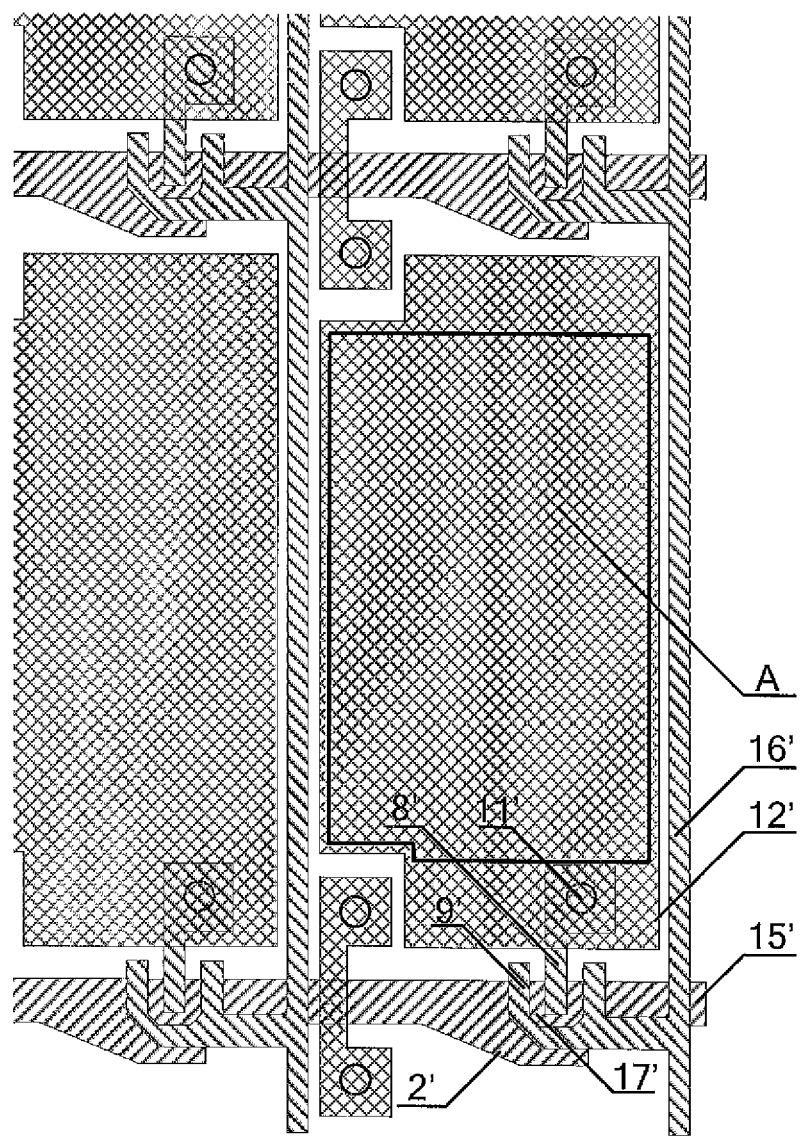
FIG. 1 is a schematic plan view of an array substrate in prior art

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

It needs to be noted that terms "upper", "lower", "inner" and "outer" in embodiments of the present invention are just used to describe the embodiments of the present invention referring to the drawings and are not used as limitative terms.

A First Embodiment

Figure 2:
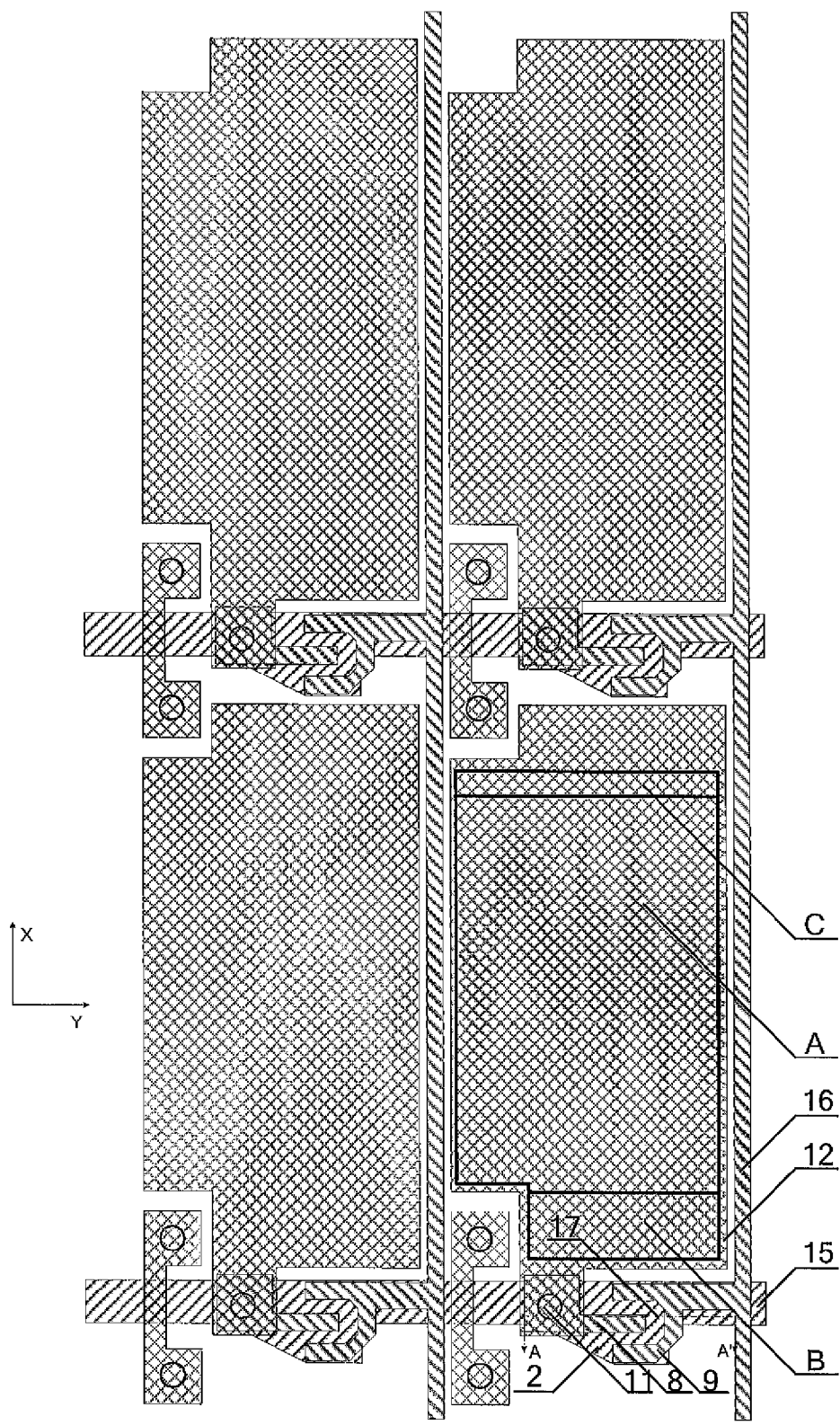
FIG. 2 is a schematic plan view of an array substrate according to an embodiment of the present invention.
Figure 3:
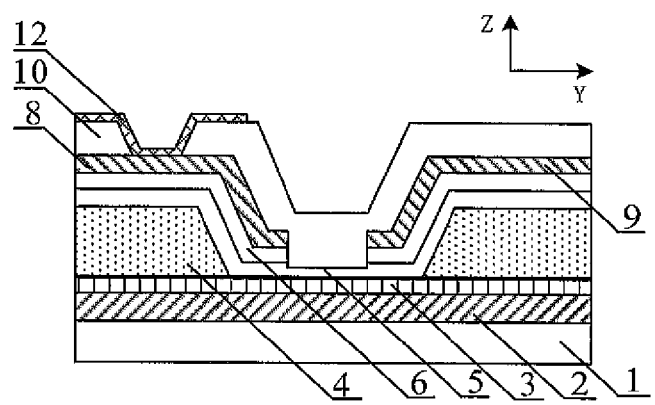
FIG. 3 is a cross-sectional view of the array substrate in FIG. 2 taken along line A-A'.

FIG. 2 shows a planar schematic view of an array substrate according to the first embodiment of the present invention, in which a structure of one pixel unit is shown, and FIG. 3 is a cross-sectional view of the array substrate in FIG. 2 taken along line A-A'. As shown in FIGS. 2 and 3, the array substrate comprises: a substrate 1; a plurality of data lines 16, formed on the substrate 1 and extending along a first direction; a plurality of gate lines 15, formed on the substrate 1, crossing the data lines 16 and extending in a second direction perpendicular to the first direction; a plurality of pixel regions, defined by the plurality of gate lines 15 and the plurality of data lines 16 crossing each other and arranged in a matrix form, wherein each of the plurality of pixel regions is formed with a thin film transistor and a pixel electrode 12, the gate lines 15 are used to provide a switching-on signal to the thin film transistor, and the data lines 16 are used to provide a data signal to the pixel electrode 12. Also, the thin film transistor comprises: a gate electrode 2, formed on the substrate 1 and connected with the gate line 15; a gate insulating layer 3, formed on the gate line 15 and the gate electrode 2 and covering the entirety of the substrate; an active layer 5, formed on the gate insulating layer 3; a drain electrode 8 formed above the active layer and a source electrode 9 disposed opposite to the drain electrode 8 and connected with the data line 16, wherein a controllable electrical connection of the source electrode 9 and the drain electrode 8 can be achieved through a channel region 17 of the active layer; a passivation layer 10, formed on the source electrode 9, the drain electrode 8 and the channel region 17, wherein a filling layer 4 is provided between the gate electrode and the drain electrode, the source electrode.

In this embodiment, description is made taking it as an example that the filling layer is formed between the gate insulating layer 3 and the active layer 5, as the filling layer 4 increases a distance between the gate line 15 and the drain and source electrodes 8 and 9 in a thickness direction of the array substrate, that is, a distance in a direction z, and thus, a capacitance formed between the gate line 15 and the source electrode 9, the pixel electrode 12 is decreased. Furthermore, at a position of the passivation layer 10 above the gate line 15, a passivation layer through hole 11 is provided to enable a connection between the drain electrode 8 and the pixel electrode 12. By comparing FIG. 1 with FIG. 2, it is seen that providing the passivation layer through hole right above the gate line 15 can greatly increase an effective light-transmitting region and thus, increase the aperture ratio of the pixel; the increased effective light-transmitting region is shown by a region B in the drawings. In a practical application, taking a 23.6 inch product with a full HD resolution (1920×1080) as an example, the aperture ratio can be increased by 5%-10%.

The filling layer 4 mainly serves to increase the distance between the gate insulating layer 3 and the drain and source electrodes 8 and 9, and thus reduce the capacitance formed between the gate line 15 and the source electrode 9, the pixel electrode 12. An exemplary material of the filling layer 4 is a dielectric material, and thus, an effect of lowering the capacitance will not be affected due to the filling layer 4; the filling layer 4 in this embodiment is formed through a curing reaction of the photosensitive resin, thus the difficulty in forming the filling layer 4 is lowered besides not affecting the effect of lowering the capacitance.

If the filling layer 4 is too thick, a final product will be rendered too thick, if the filling layer 4 is too thin, the effect of reducing the leaping voltage cannot be achieved. In the embodiments of the present invention, a thickness of the filling layer is 5000 Å-25000 Å, thus the product will not be made too thick, and the effect of not increasing the leaping voltage can also be achieved. Furthermore, the thickness of the filling layer is 15000 Å.

In addition, the embodiments of the present invention further increase an area of the effective light-transmitting region through changing a direction of an opening of the channel region. The channel region in prior art presents a U shape whose opening is oriented in a extending direction of the data line, as denoted by 17' in FIG. 1, while the opening of the channel region 17 in this embodiment faces away from the data line 16; therefore, compared with the prior art, a width of the needed gate line is reduced, and a normal function can be achieved as long as the width of the gate line 15 is identical with that of the channel region 17; reducing the width of the gate line 15 means increasing the area of the effective light-transmitting region by a corresponding area and then increasing the aperture ratio of the pixel. By comparing FIG. 1 with FIG. 2, the increased effective light-transmitting region is shown by a region C and in a practical application, taking a 23.6 inch product with a full HD resolution (1920×1080) as an example, the aperture ratio can be increased by 2%-5%.

It needs to be noted that the array substrate according to the first embodiment of the present invention is described and illustrated with a bottom gate type TFT structure, and this is only one TFT structure for achieving the array substrate of the embodiments of the present invention, and in practice, a common top gate type TFT structure or a varied known TFT structure can also be used, for the common top gate type TFT structure or varied known TFT structure, the technical solution that the filling layer is filled between the gate electrode and the drain and source electrodes and/or that the U shape opening of the channel region faces away from the data line is also used to improve the aperture ratio of the display device, which is the same with the bottom gate type TFT structure and thus is omitted herein.

A Second Embodiment

The second embodiment of the present invention further provides a manufacturing method of the above array substrate, mainly comprising: forming a gate line and a gate electrode on a substrate and forming a gate insulating layer covering the entirety of the substrate on the gate line and the gate electrode; forming an active layer, a drain electrode and a source electrode on the gate insulating layer; forming a filling layer between the gate electrode and the drain electrode, the source electrode; forming a passivation layer on the source electrode, the drain electrode and a channel region; providing a passivation layer through hole at a position of the passivation layer right above the gate line and the drain electrode; and forming a pixel electrode which is connected with the drain electrode through the passivation layer through hole. In this embodiment, description is made taking it as an example that the filling layer is formed between the gate electrode and the drain and source electrodes.

The manufacturing method of the array substrate according to the embodiments of the present invention mainly comprises the following steps:

S1, after cleaning the substrate 1, forming a gate line 15 and a gate electrode 2 on the substrate 1 and forming a gate insulating layer 3 covering the entirety of the substrate on the gate line 15 and the gate electrode 2.

Figure 4:
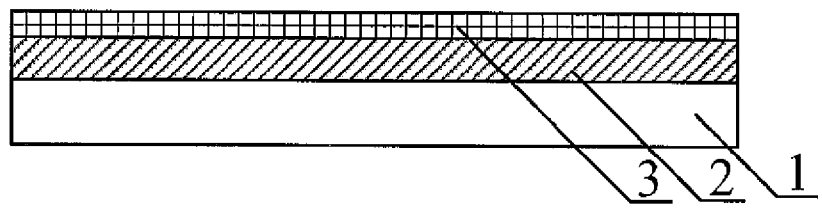
FIG. 4 is a schematic cross-sectional view of the array substrate after a gate electrode and a gate insulating layer are formed on a substrate in a manufacturing method of the array substrate according to an embodiment of the present invention.

The step mainly comprises:

S101, forming the gate line 15 and the gate electrode 2 on the substrate 1: depositing a gate metal film on the substrate 1 (for example, a glass substrate 1 or a quartz substrate 1) by using a magnetron sputtering method or a thermal evaporation method; the gate metal film can use a metal such as Cr, W, Ti, Ta, Mo, Al, Cu or the alloy thereof, or use a composite film constituted by a plurality of metal films; then using a common mask, etching the gate metal film through a patterning process to form the gate line 15 and the gate electrode 2 of the thin film transistor on the substrate 1; and S102, forming the gate insulating layer 3 covering the entirety of the substrate on the gate line 15 and the gate electrode 2, a thickness of the gate insulating layer 3 is 3000 Å-5000 Å, as shown in FIG. 4, the gate insulating layer 3 can use an oxide, a nitride, an oxynitride or etc.

S2, forming the filling layer 4 on the gate insulating layer 3, in this embodiment, description is made taking it as an example that photosensitive resin is used to form the filling layer.

Figure 5:
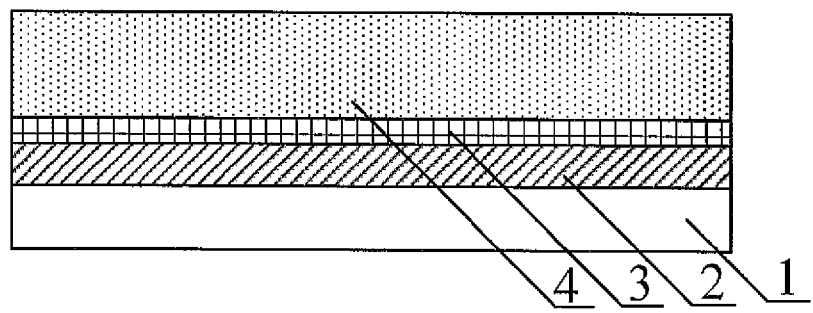
FIG. 5 is a schematic cross-sectional view of the array substrate after coating a photosensitive resin layer on the substrate of FIG. 4.
Figure 6:
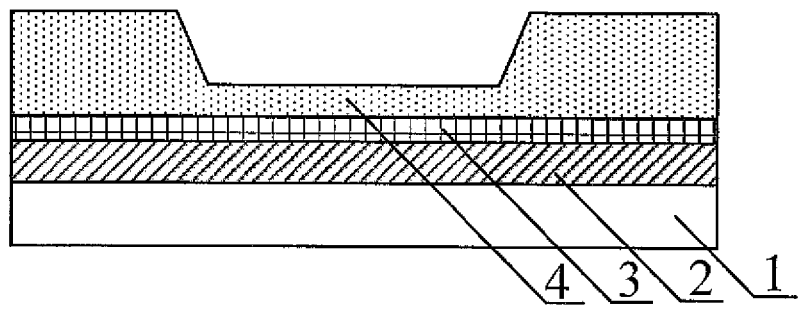
FIG. 6 is a schematic cross-sectional view of a photosensitive resin-partly-retained region after a substrate of FIG. 5 is subjected to a developing treatment.
Figure 7:
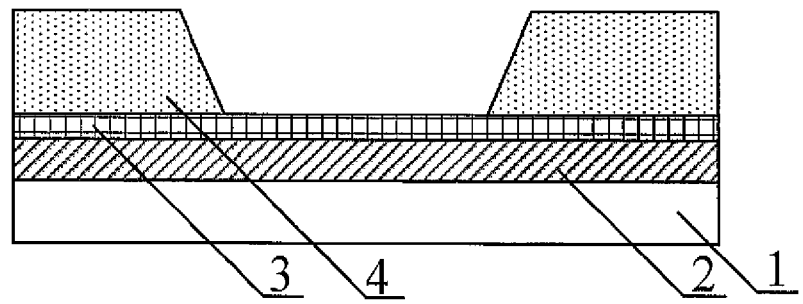
FIG. 7 is a schematic cross-sectional view of a photosensitive resin-completely-removed region after the substrate of FIG. 5 is subjected to the developing treatment.
Figure 8:
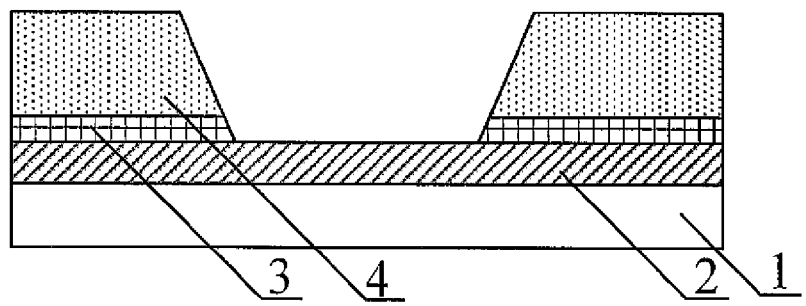
FIG. 8 is a schematic cross-sectional view of the array substrate after performing an etching process on the substrate of FIG. 7.
Figure 9:
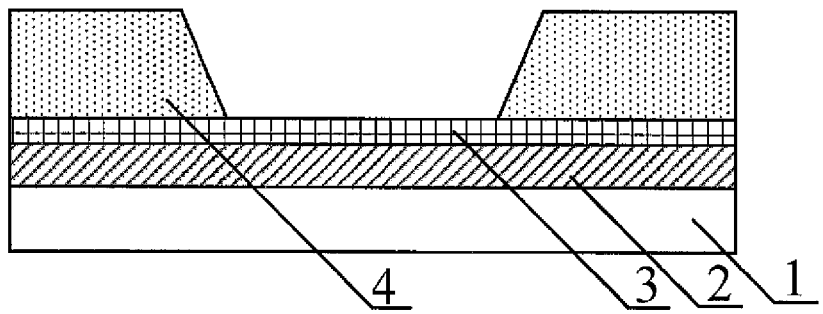
FIG. 9 is a schematic cross-sectional view of the array substrate after performing an ashing process on the substrate of FIG. 6.

The step mainly comprises:

S201, coating on the gate insulating layer 3 a layer of photosensitive resin having a thickness of 5000 Å-25000 Å, as shown in FIG. 5;

S202, by an exposing process using a double-tone mask, forming a photosensitive resin-completely-retained region corresponding to the filling layer 4 to be formed, a photosensitive resin-partly-retained region corresponding to the channel region 17, and a photosensitive resin-completely-removed region corresponding to a gate electrode connecting region;

S203, after a developing treatment, a thickness of the photosensitive resin in the photosensitive resin-completely-retained region does not change; the photosensitive resin in the photoresist-completely-removed region is completely removed, as shown in FIG. 7; the photosensitive resin in the photosensitive resin-partly-retained region becomes thin, as shown in FIG. 6; then the gate insulating layer 3 in the photosensitive resin-completely-removed region is removed through an etching process, so the gate electrode 15 is exposed, the gate electrode connection region is formed, as shown in FIG. 8; therefore, the distance between the gate electrode and the channel region can be made unchanged to prevent the increasing of the drive voltage of the gate electrode; and S204, removing the photosensitive resin in the photosensitive resin-partly-retained region through an ashing process to expose the gate insulating layer 3, as shown in FIG. 9;

S3, forming the active layer, the drain electrode 8 and the source electrode 9 on the gate insulating layer 3 and the filling layer 4, wherein, a part of the active layer between the source electrode 9 and the drain electrode 8 forms the channel region, and the active layer in this embodiment comprises a semiconductor layer 5 and a doping semiconductor layer 6.

Figure 10:
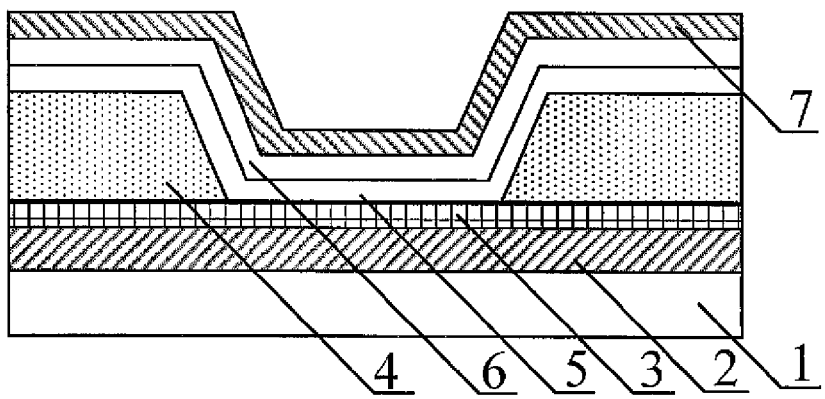
FIG. 10 is a schematic cross-sectional view of the array substrate after an active layer and a source/drain metal layer are sequentially deposited on the substrate of FIG. 9.
Figure 11:
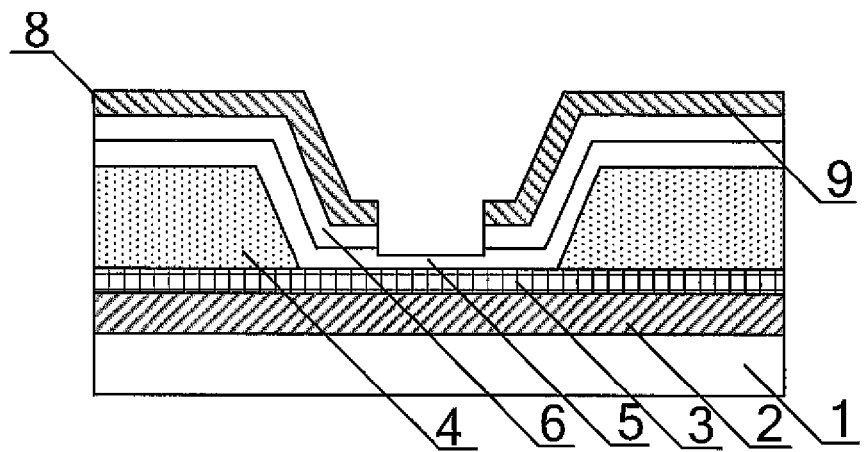
FIG. 11 is a schematic cross-sectional view of the array substrate after the active layer, a source electrode, a drain electrode and a channel region of the active layer are formed on the substrate of FIG. 10.

The step mainly comprises:

S301, Sequentially depositing the semiconductor layer 5 and the doping semiconductor layer 6 on the gate insulating layer 3 and the filling layer 4 using a PECVD (Plasma Enhanced Chemical Vapor Deposition) method; then depositing a source/drain metal layer 7 using a magnetron sputtering method or a thermal evaporation method, which is specifically shown in FIG. 10; the source/drain metal layer 7 can use Cr, W, Ti, Ta, Mo, Al, Cu or the alloy thereof, or comprises a composite layer of a plurality of metal layers;

S302, coating a layer of photoresist on the source/drain metal layer 7;

S303, forming a photoresist-completely-retained region corresponding to regions of the source electrode 9 and the drain electrode 8, a photoresist-partly-retained region corresponding to the channel region 17, and a photoresist-completely-removed region corresponding to regions expect the above regions by an exposing process using a double-tone mask;

S304, after a developing treatment, a thickness of the photoresist in the photoresist-completely-retained region does not change, the photoresist in the photoresist-completely-removed region is completely removed, and the photoresist in the photoresist-partly-retained region becomes thin; then removing the source/drain metal layer 7, the doping semiconductor layer 6 and the semiconductor layer 5 in the photoresist-completely-removed region through a first etching process to form the active layer;

S305, removing the photoresist in the photoresist-partly-retained region through an ashing process to exposing the source/drain metal layer 7 in this region;

S306, removing the source/drain metal layer 7 and the doping semiconductor layer 6 in the photoresist-partly-retained region through a second etching process, and removing a part of the semiconductor layer 5 in a thickness direction to form the source electrode 9, the drain electrode 8 and the channel region 17; and S307, removing the remaining photoresist to obtain a specific structure as shown in FIG. 11.

Figure 12:
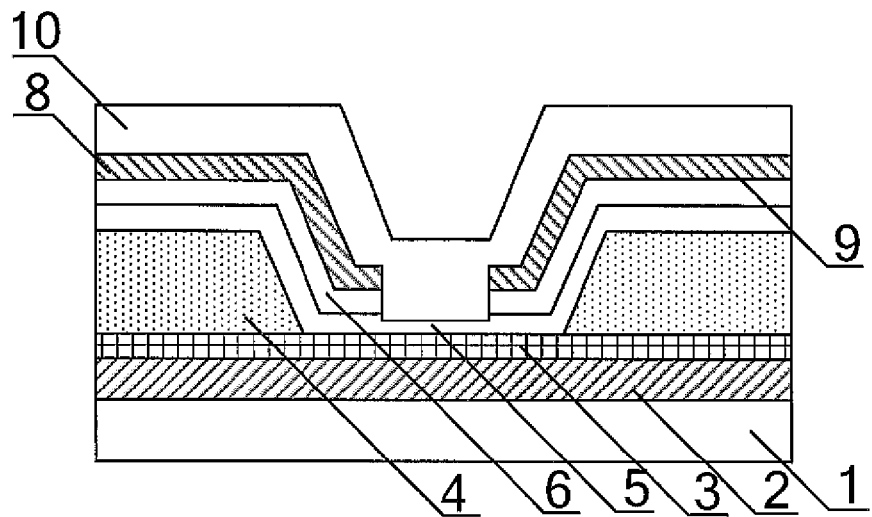
FIG. 12 is a schematic cross-sectional view of the array substrate after a passivation layer is formed on the substrate of FIG. 11.

S4, depositing the passivation layer 10 on the source electrode 9, the drain electrode 8 and the channel region 17 with the PECVD method, as shown in FIG. 12.

Figure 13:
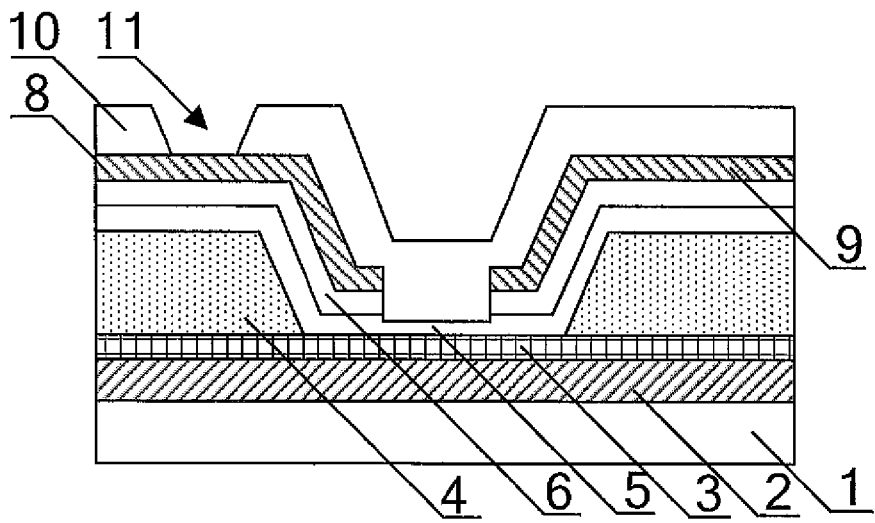
FIG. 13 is a schematic cross-sectional view of the array substrate after providing a passivation layer through hole in the substrate of FIG. 12.

S5, forming the passivation layer through hole 11 at a position of the passivation layer 10 right above the gate line 15 and the drain electrode 8 with a common mask through a patterning process, as shown in FIG. 13.

Figure 14:
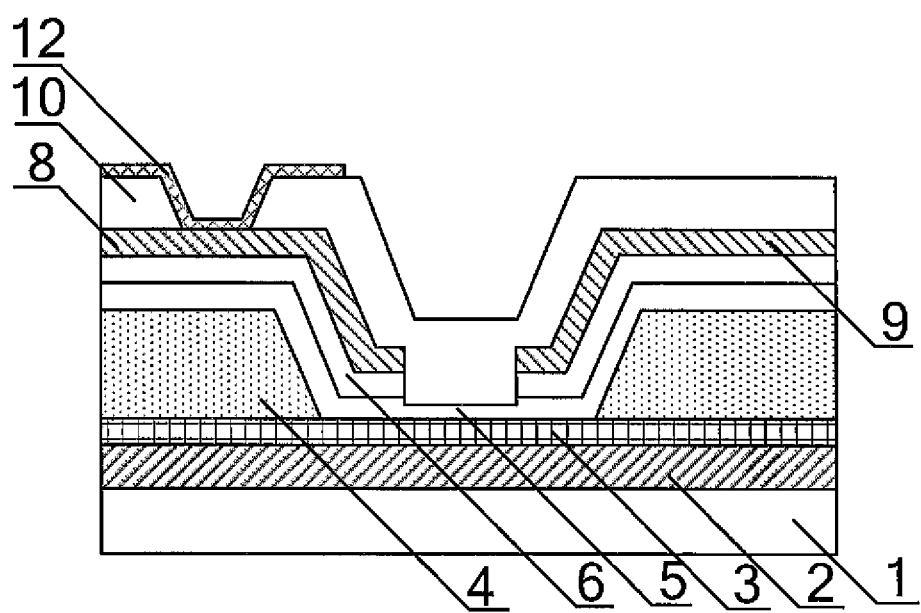
FIG. 14 is a schematic cross-sectional view of the array substrate after forming a pixel electrode on the substrate of FIG. 13.

S6, forming the pixel electrode 12 which is connected with the drain electrode 8 through the passivation layer through hole 11;

The step comprises:

S601, depositing a layer of transparent conductive film with a magnetron sputtering method or a thermal evaporation method, wherein the transparent conductive film can use a single-layer film of ITO (Indium Tin Oxide) or IZO (Indium Zinc Oxide) or a composite film of ITO and IZO; and S602, forming the pixel electrode 12 in the pixel region using a common mask through a patterning process, wherein the pixel electrode 12 is connected with the drain electrode 8 through the passivation layer through hole 11, as shown in FIG. 14.

It needs to be noted that the manufacturing method of the array substrate in the second embodiment is just one manufacturing method for fabricating the array substrate according to the first embodiment of the present invention, and in the practice, this can be achieved through increasing or reducing the number of the patterning processes and selecting a different material or a combination of the materials.

A Third Embodiment

The third embodiment of the present invention further provides a display device comprising the array substrate according to the first embodiment; due to the increased pixel aperture ratio, the display device has the high light transmittance and the high resolution, and also, due to the reduced power consumption of a backlight module, the cost is saved and the display quality is improved.

One example of the display device is a liquid crystal display device, wherein the above array substrate and an opposite substrate are disposed to face each other to form a liquid crystal cell, and a liquid crystal material is filled in the liquid crystal cell. The opposite substrate is a color filter substrate, for example. A pixel electrode of each pixel unit of the array substrate is used to apply an electric field, so as to control a rotation of the liquid crystal material and to perform a displaying operation. In some examples, the liquid crystal display device further comprises a backlight source provided for the array substrate.

Another example of the display device is an organic light emitting display (OLED) device, wherein a pixel electrode of each pixel unit of the above array substrate is used as an anode or a cathode to drive organic light-emitting material to emit light so as to perform a displaying operation.

Exemplarily, the display device according to the embodiments of the present invention can be used in any product with a display function, such as a television, a electronic paper, a digital photo frame, a mobile phone and a tablet computer.

For the array substrate according to the embodiments of the present invention, first, a filling layer is formed between the gate electrode and the drain and source electrodes, as the filling layer increases a distance between the gate electrode and the drain and source electrodes, a capacitance formed between the gate line and the source electrode, the pixel electrode is reduced; furthermore, the passivation layer through hole of the array substrate is formed above a gate line region, thus, a effective light-transmitting region can be increased, in turn, the aperture ratio of the pixel is increased, and a leaping voltage is not increased, then defects such as an image flicker or an image sticking will not be incurred; therefore, the embodiments of the present invention enhances light transmittance and resolution, and also, due to the reduced power consumption of a backlight source, the cost is saved and the display quality of the display device using the array substrate is improved as while.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. An array substrate, comprising:
   a substrate;
   a plurality of data lines, formed on the substrate and extending in a first direction;
   a plurality of gate lines, formed on the substrate, crossing the plurality of data lines, and extending in a second direction perpendicular to the first direction;
   a plurality of pixel regions, defined by the plurality of gate lines and the plurality of data lines crossing each other and arranged in a matrix form, wherein each of the pixel regions is provided with a thin film transistor and a pixel electrode,
   wherein, the thin film transistor comprises:
      a gate electrode, connected with one of the plurality of gate lines;
      a gate insulating layer, provided above the gate line and the gate electrode;
      an active layer, formed on the gate insulating layer and disposed corresponding to the gate electrode;
      a drain electrode and a source electrode, disposed opposite to each other above the active layer and having a channel region of the thin film transistor therebetween;
      a filling layer, provided between the gate electrode and the gate line connected with the gate electrode, and the drain and source electrodes; and
      a passivation layer, provided on the source electrode, the drain electrode and the active layer, wherein from a top-down perspective, at a position directly facing the gate line, the passivation layer is provided with a passivation layer through hole configured to perform a connection between the drain electrode and the pixel electrode,
   wherein the active layer positioned in the channel region and the filling layer are directly formed on the gate insulating layer and positioned in a same plane.

2. The array substrate according to claim 1, wherein a thickness of the filling layer is 5000 Å-25000 Å.

3. The array substrate according to claim 2, wherein a thickness of the filling layer is 15000 Å.

4. The array substrate according to claim 1, wherein the filling layer is formed with a dielectric material.

5. The array substrate according to claim 4, wherein the filling layer is formed by a curing reaction of a photosensitive resin.

6. The array substrate according to claim 1, wherein the channel region is in a U shape whose opening faces away from the corresponding data line.

7. The array substrate according to claim 6, wherein a width of the gate line is equal to a width of the channel region.

8. The array substrate according to claim 1, wherein the active layer comprises a semiconductor layer and a doping semiconductor layer.

9. The array substrate according to claim 8, wherein, the channel region comprises only the semiconductor layer.

10. A display device, comprising the array substrate according to claim 1.

11. A manufacturing method of an array substrate, comprising:
    S1, providing a substrate;
    S2, forming a gate line and a gate electrode on the substrate;
    S3, forming a gate insulating layer covering the entirety of the substrate on the gate line and the gate electrode;
    S4, forming a filling layer on the gate insulating layer, and the filling layer being formed between the gate electrode and the gate line connected with the gate electrode, and drain and source electrodes formed subsequently;
    S5, forming an active layer, the drain electrode and the source electrode on the substrate with the gate insulating layer and the filling layer formed thereon;
    S6, forming a passivation layer on the source electrode, the drain electrode and the active layer, wherein the passivation layer is provided with a passivation layer through hole at a position right above the gate line and the drain electrode, from a top-down perspective; and
    S7, forming a pixel electrode on the passivation layer, the pixel electrode being connected with the drain electrode through the passivation layer through hole, wherein the active layer positioned in the channel region and the filling layer are directly formed on the gate insulating layer and positioned in a same plane.

12. The manufacturing method of the array substrate according to claim 11, wherein the step S4 comprises:
    S401, coating a layer of photosensitive resin on the gate insulating layer;
    S402, through an exposing process using a double-tone mask, forming a photosensitive resin-completely-retained region corresponding to the filling layer, a photosensitive resin-partly-retained region corresponding to the channel region, and a photosensitive resin-completely-removed region corresponding to a gate electrode connection region;
    S403, after a developing treatment, removing the gate insulating layer in the photosensitive resin-completely-removed region through an etching process; and
    S404, removing the photosensitive resin in the photosensitive resin-partly-retained region through an ashing process to expose the gate insulating layer.

13. The manufacturing method of the array substrate according to claim 11, wherein, the step S5 comprises:
    S501, depositing a semiconductor layer, a doping semiconductor layer and a source/drain metal layer on the gate insulating layer and the filling layer;
    S502, coating a layer of photoresist on the source/drain metal layer;
    S503, through an exposing process using a double-tone mask, forming a photoresist-completely-retained region corresponding to regions of the source electrode and the drain electrode, a photoresist-partly-retained region corresponding to the channel region, and a photoresist-completely-removed region corresponding to regions except the above regions;
    S504, after a developing treatment, removing the source/drain metal layer, the doping semiconductor layer and the semiconductor layer in the photoresist-completely-removed region through a first etching process;

S505, removing the photoresist in the photoresist-partly-retained region through an ashing process;

S506, removing the source/drain metal layer and the doping semiconductor layer in the photoresist-partly-retained region through a second etching process, and removing a part of the semiconductor layer in a thickness direction; and S507, removing the remaining photoresist.

14. The manufacturing method of the array substrate according to claim 11, wherein, the step S7 comprises:

S701, depositing a layer of transparent conductive film which comprises a single-layer film of ITO (Indium Tin Oxide) or IZO (Indium Zinc Oxide) or a composition film of ITO and IZO; and S702, forming the pixel electrode in a pixel region using a common mask through a patterning process, and the pixel electrode being electrically connected with the drain electrode through the passivation layer through hole.

* * * * *